(12) United States Patent
Li et al.

(10) Patent No.: US 8,466,539 B2
(45) Date of Patent: Jun. 18, 2013

(54) MRAM DEVICE AND METHOD OF ASSEMBLING SAME

(75) Inventors: Jun Li, Tianjin (CN); Jianhong Wang, Tianjin (CN); Xuesong Xu, Tianjin (CN); Jinzhong Yao, Tianjin (CN); Wanming Yu, Tianjin (CN)

(73) Assignee: Freescale Semiconductor Inc., Austin, TX (US)

( * ) Notice: Subject to any disclaimer, the term of this patent is extended or adjusted under 35 U.S.C. 154(b) by 53 days.

(21) Appl. No.: 13/334,006

(22) Filed: Dec. 21, 2011

(65) Prior Publication Data

US 2012/0211846 A1    Aug. 23, 2012

(30) Foreign Application Priority Data

Feb. 23, 2011    (CN) .......................... 2011 1 0044560

(51) Int. Cl.
*H01L 23/552*    (2006.01)
(52) U.S. Cl.
USPC ............. 257/659; 257/98; 257/422; 257/660; 257/678; 257/E23.001; 257/E23.114; 257/E21.499; 438/3; 438/51; 438/55; 438/64; 438/106; 438/108; 438/112; 438/118; 438/124; 438/125; 438/126; 438/127
(58) Field of Classification Search
USPC ............ 257/98, 422, 660, 659, 678, E23.001, 257/E23.114, E21.499; 438/3, 51, 55, 64, 438/106, 108, 112, 118, 124, 125, 126, 127
See application file for complete search history.

(56) References Cited

U.S. PATENT DOCUMENTS

| | | | |
|---|---|---|---|
| 5,166,772 A | 11/1992 | Soldner | |
| 5,294,826 A | 3/1994 | Marcantonio | |
| 5,557,142 A | 9/1996 | Gilmore | |
| 5,679,975 A | 10/1997 | Wyland | |
| 6,097,080 A * | 8/2000 | Nakanishi et al. | 257/659 |
| 6,211,462 B1 | 4/2001 | Carter | |
| 6,306,526 B1 | 10/2001 | Yamamoto | |
| 6,642,609 B1 | 11/2003 | Minamio | |
| 6,734,552 B2 | 5/2004 | Combs | |
| 7,030,469 B2 | 4/2006 | Mahadevan et al. | |
| 8,399,964 B2 * | 3/2013 | Katti | 257/659 |
| 2004/0232536 A1 * | 11/2004 | Fukuzumi | 257/684 |
| 2006/0019422 A1 | 1/2006 | Tuttle | |
| 2007/0285957 A1 * | 12/2007 | Stobbs | 365/53 |
| 2008/0197434 A1 * | 8/2008 | Kato et al. | 257/421 |
| 2009/0184403 A1 | 7/2009 | Wang | |
| 2010/0164077 A1 * | 7/2010 | Bando et al. | 257/659 |

FOREIGN PATENT DOCUMENTS

| | | |
|---|---|---|
| JP | 10-284873 | 10/1998 |
| JP | 2005-158985 | 6/2005 |

* cited by examiner

*Primary Examiner* — Asok K Sarkar
(74) *Attorney, Agent, or Firm* — Charles Bergere

(57) ABSTRACT

A method of assembling a magnetoresistive random access memory (MRAM) device includes providing a substrate having an opening. A tape is applied to a surface of the substrate and a first magnetic shield is placed onto the tape and within the substrate opening. An adhesive is applied between the first magnetic shield and the substrate to attach the first magnetic shield to the substrate. An MRAM die is attached to the first magnetic shield and bond pads of the MRAM die are connected to pads on the substrate with wires. A second magnetic shield is attached to a top surface of the MRAM die. An encapsulating material is dispensed onto the substrate, the MRAM die, the second magnetic shield and part of the first magnetic shield, cured, and then the tape is removed. Solder balls then may be attached to the substrate.

20 Claims, 4 Drawing Sheets

MRAM DEVICE AND METHOD OF ASSEMBLING SAME

BACKGROUND OF THE INVENTION

The present invention relates generally to semiconductor device packages, and more particularly to magnetic shielded semiconductor device packages.

Magnetic materials are used in a variety of semiconductor devices such as magnetic cell memories and magnetic field sensors. Magnetic random access memory (MRAM) devices are being explored for use as non-volatile solid state memory devices for embedded and stand alone applications. Typically MRAM devices utilize magnetic material within memory cells to store data bits.

MRAM devices may be subject to error in the presence of stray or externally applied electromagnetic fields other than applied write fields. Such stray fields can originate from a variety of sources including other electronic devices such as computers, displays, etc. and may have sufficient magnitude to switch the logic state of one or more memory cells even in the absence of a write field.

One way of protecting the MRAM devices from the external environment is by encapsulation with an epoxy material or transfer molding a thermoplastic resin around the device. However, the epoxy or plastic encapsulent does not provide effective shielding from radiation such as EMI or RFI.

Other systems use magnetic shielding materials to shield the device from magnetic fields. FIG. 1 is a cross-sectional view of a conventional ball grid array package 10 having a MRAM die 12. The MRAM die 12 is attached to and electrically coupled to a substrate 14 with wires 16. The wires 16 are bonded to corresponding pads 18 on the substrate using a well known wire bonding process.

A magnetic shield 20 is attached to a top surface of the MRAM die 12. The magnetic shield 20 may include a traditional Ni/Fe shield for protecting the MRAM die 12 from external magnetic fields. An encapsulating material 22 such as epoxy molding compound covers the substrate 14, the MRAM die 12 and the magnetic shield 20. The package 10 also includes solder balls 22 attached to the substrate 14 for providing external electrical interconnection.

However, as can be seen, the magnetic shield 20 provides protection to only one side of the die 12, while the other side is still susceptible to stray magnetic waves. Therefore a need exists for a semiconductor package with enhanced magnetic resistance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

FIG. 3A shows a substrate with a centrally located opening;

FIG. 3B illustrates a step of applying a tape to the substrate;

FIG. 3C illustrates a step of placing a first magnetic shield within the substrate opening;

FIG. 3D illustrates a step of attaching the first magnetic shield to the substrate via an adhesive;

FIG. 3E illustrates a step of curing the adhesive;

FIG. 3F illustrates a step of removing the tape from the substrate;

FIG. 3G illustrates a step of attaching the semiconductor die to the first magnetic shield;

FIG. 3H illustrates a step of electrically connecting the MRAM die to the substrate;

FIG. 3I illustrates a step of attaching a second magnetic shield to the MRAM die;

FIG. 3J illustrates a step of dispensing an encapsulating material onto the substrate; and FIG. 3K illustrates a step of curing the encapsulating material and attaching solder balls to the substrate.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method of assembling a magnetoresistive random access memory (MRAM) device. The method includes providing a substrate having a centrally located opening therein. A tape is applied to a first major surface of the substrate and a first magnetic shield is placed onto the tape and within the substrate opening. An adhesive is applied between the first magnetic shield and the substrate such that the first magnetic shield is attached to the substrate. The adhesive is cured. A semiconductor die is attached to a top surface of the first magnetic shield and bond pads of the MRAM die are electrically connected to corresponding pads on a second major surface, opposite to the first major surface, of the substrate with wires using a wire bonding process. A second magnetic shield is attached to a top surface of the MRAM die. An encapsulating material is dispensed onto the second major surface of the substrate, the MRAM die, the second magnetic shield and a portion of the top surface of the first magnetic shield. The encapsulating material is then cured and the tape is removed. Solder balls are then attached to the first major surface of the substrate.

In another embodiment, the present invention is a MMRAM device assembled in accordance with the above-described method.

Figure 1:
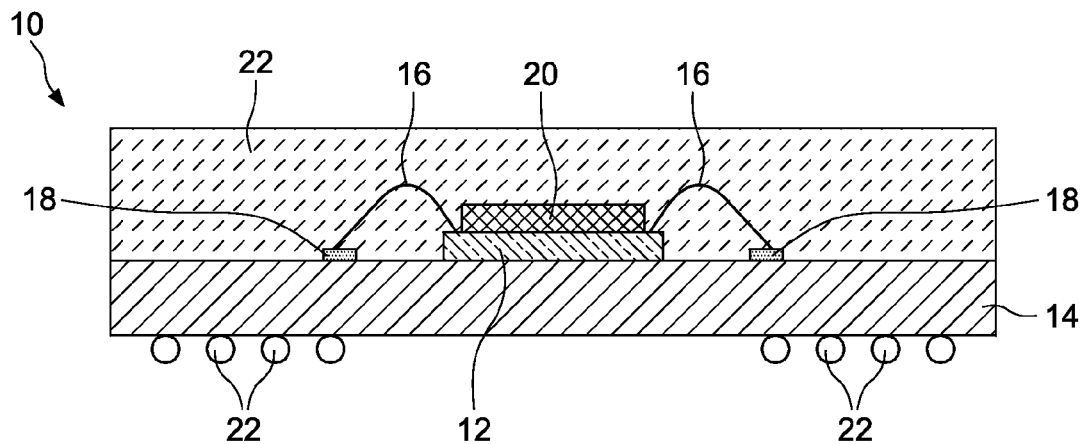
FIG. 1 is an enlarged, cross-sectional side view of a prior art semiconductor device.
Figure 2:
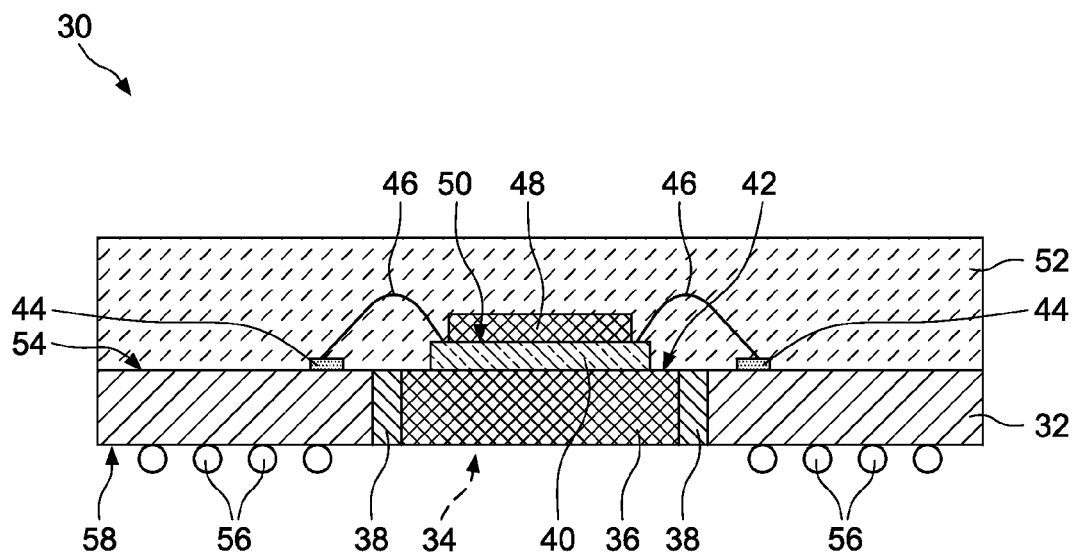
FIG. 2 is an enlarged, cross-sectional side view of a semiconductor device in accordance with one embodiment of the present invention.

Referring now to FIG. 2, an enlarged, cross-sectional side view of a semiconductor device 30 in accordance with an embodiment of the present invention is shown. In this exemplary embodiment, the semiconductor device 30 is fabricated utilizing ball grid array (BGA) surface mount techniques. The semiconductor device 30 includes a substrate 32 having a centrally located opening 34 therein. The substrate 32 may include a Bismaleimide Triazine (BT) substrate, which is typically used for Ball Grid Array (BGA) products.

Alternatively the substrate may include a metal substrate such as Alloy 42 or plated copper, plated aluminium, plated plastics or the like. Plated materials may include copper, silver or multi-layer plating such as nickel-palladium and gold. In one exemplary embodiment of the present invention, the substrate 32 includes a multi-layered printed wiring board. The substrate opening 34 can be formed by dry etching, or by wet etching as is known in the art.

A first magnetic shield 36 is disposed within the opening 34. The first magnetic shield 36 may be formed of any material that is able to shield or prevent magnetic waves from passing from one side of the shield to the other. In this exemplary embodiment of the present invention, the first magnetic shield 36 is a Ni/Fe slug. The first magnetic shield 36 is attached to the substrate 32 via an adhesive material 38 such as epoxy.

A semiconductor die 40 is attached to a top surface 42 of the first magnetic shield 36 and is electrically coupled to the substrate 32. In this exemplary embodiment of the invention, the semiconductor die 40 includes a magnetoresistive random access memory (MRAM) die. However, as will be understood by those of skill in the art, other dies used to implement other circuits that require magnetic shielding also may be used. The MRAM die 40 may be attached to the substrate using a die attach adhesive such as epoxy or elastomer. However, other suitable adhesive materials may be utilized. The MRAM die 40 and the substrate 32 are well known components and thus detailed descriptions and possible alternative embodiments thereof are not necessary for a complete understanding of the present invention.

In this exemplary embodiment of the invention, bond pads of the MRAM die 40 are electrically coupled to corresponding pads 44 of the substrate 32 with wires 46. The wires 46 are bonded to pads of the MRAM die 40 and to corresponding contact pads 44 on the substrate 32 using a well known wire bonding process and known wire bonding equipment. The wires 46 may be formed from a conductive material such as aluminium or gold.

A second magnetic shield 48 is attached to a top surface 50 of the MRAM die 40. In this exemplary embodiment, the second magnetic shield 48 also is a Ni/Fe slug. However, other suitable materials having high permeability may be employed for the first and second magnetic shields 36 and 48. The first and second magnetic shields 36 and 48 are fabricated to specific dimensions utilizing known manufacturing methods. The first and second magnetic shields 36 and 48 provide electromagnetic shielding of the MRAM die 40 from both top and bottom sides of the die 40 thereby enhancing magnetic resistance of the device 30.

An encapsulating material 52 covers a top surface 54 of the substrate 32, the MRAM die 40, the second magnetic shield 48, and a portion of the top surface 42 of the first magnetic shield 40. The encapsulating material 52 may include plastic or an epoxy molding compound, as is known in the art.

A plurality of solder balls 56 such as controlled collapse chip connection (C4) solder balls are attached to a bottom surface 58 of the substrate 32 for attachment with copper pads (not shown) on an external printed circuit board (not shown) arranged in a pattern on the printed circuit board that matches the solder balls 56. The substrate 32 may include conductive traces that connect to the solder balls 56.

The solder balls 56 facilitate external electrical communication with the MRAM die 40. The device 30 is heated causing the solder balls 56 to melt. Surface tension causes the molten solder to hold the device 30 in alignment with the printed circuit board while the solder cools and solidifies. It should be noted that although a BGA surface mount technique is discussed herein, other conventional mounting techniques may be utilized.

Figure 3A:
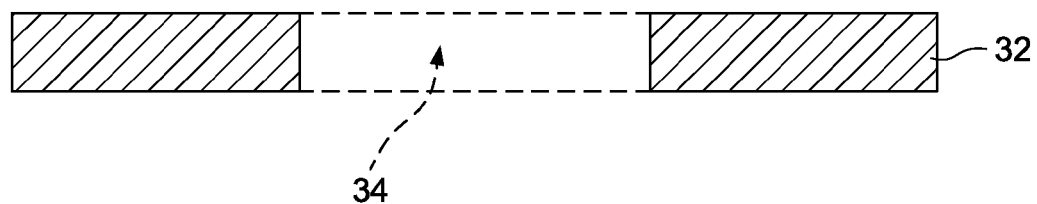
FIGS. 3A-3K illustrate steps for forming a semiconductor package in accordance with an embodiment of the present invention, where

FIGS. 3A-3K illustrate a method of forming the semiconductor device 30 of FIG. 3. FIG. 3A shows the substrate 32 with the centrally located opening 34. The substrate 32 may include a Bismaleimide Triazine (BT) substrate that is suitable for Ball Grid Array (BGA) products. Alternatively the substrate may include a metal substrate such as Alloy 42 or plated copper, plated aluminium, plated plastics or the like. Plated materials may include copper, silver or multi-layer plating such as nickel-palladium and gold. In one exemplary embodiment of the present invention, the substrate 32 includes a multi-layered printed wiring board.

Figure 3B:
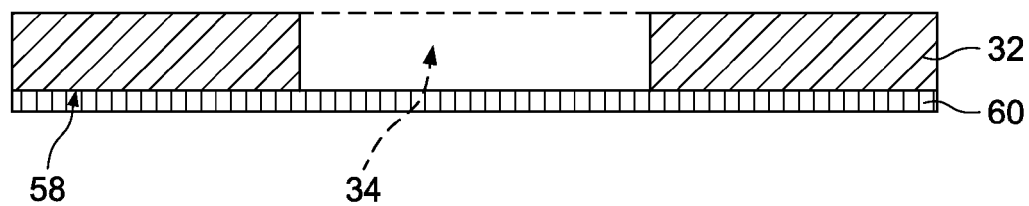
Figure 3C:
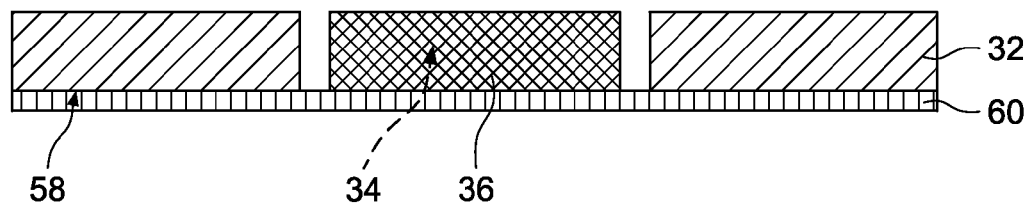

FIG. 3B is an illustration of a step of applying a tape 60 to the substrate 32. The tape 60 is applied to the first major surface 58 of the substrate. FIG. 3C is an illustration of a step of placing the first magnetic shield 36 within the substrate opening 34. The first magnetic shield 36 is placed onto the tape 60 within the opening 34. The first magnetic shield 36 may be placed on the tape 60 using a pick and place tool. In this exemplary embodiment of the present invention, the first magnetic shield 36 includes a Ni/Fe slug. The NI/Fe slug is sized and shaped to fit snugly within the opening 34 and the major surfaces of the Ni/Fe slug are flat. The first magnetic shield 36 has a thickness to match the thickness of the substrate 32.

Figure 3D:
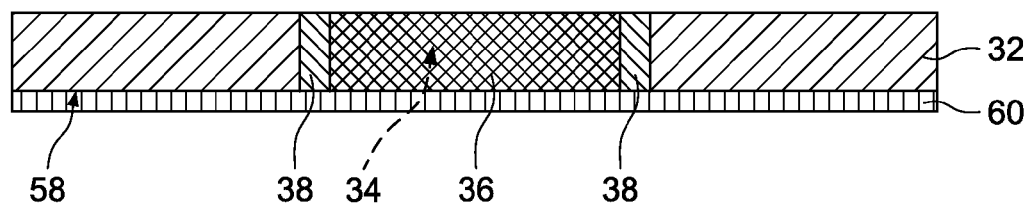
Figure 3E:
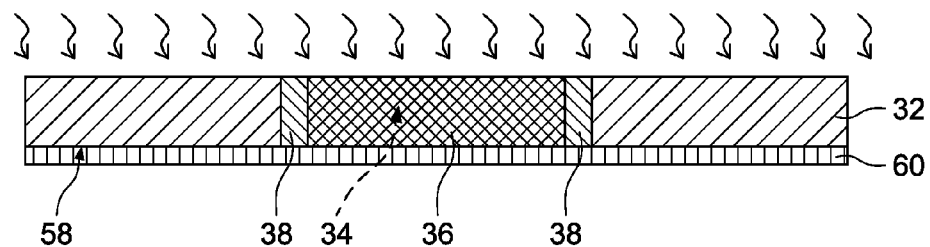
Figure 3F:
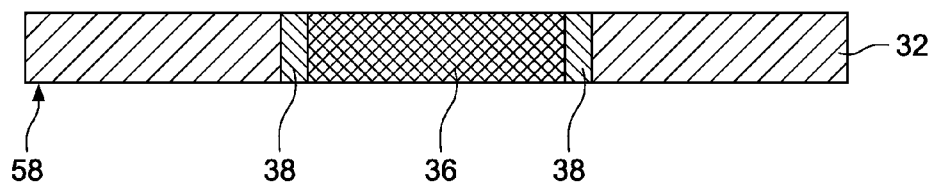

FIG. 3D is an illustration of a step of attaching the first magnetic shield 36 to the substrate 32 via the adhesive 38. The adhesive 38 is applied between the first magnetic shield 36 and the substrate 32 to attach the first magnetic shield 36 to the substrate 32. In this exemplary embodiment of the present invention, the adhesive 38 includes epoxy. The adhesive 38 is subsequently cured as shown in FIG. 3E. The tape 60 is then removed from the first major surface 58 of the substrate 32, as shown in FIG. 3F.

Figure 3G:
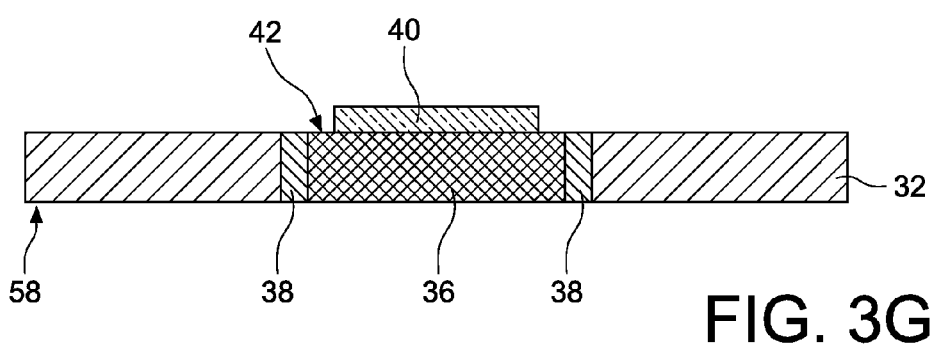

FIG. 3G is an illustration of a step of attaching the semiconductor die 40 to a top surface 42 of the first magnetic shield 36. In this exemplary embodiment of the present invention, the semiconductor die 40 includes a MRAM die. The MRAM die 40 is attached to the first magnetic shield 36 with a die attach adhesive such as die-bonding epoxy. The MRAM die 40 may be placed on the first magnetic shield 36 using a pick and place tool and the die attach adhesive is subsequently cured as is known in the art.

Figure 3H:
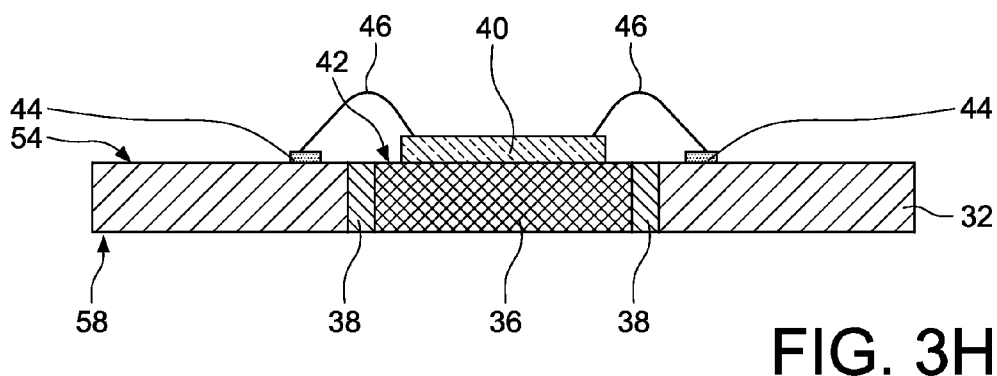

FIG. 3H shows the step of electrically connecting the MRAM die 40 to the substrate 32. In this exemplary embodiment of the invention, bond pads of the MRAM die 40 are electrically connected to the corresponding pads 44 on the second major surface 54 that is opposite the first major surface 58 with the wires 46 using a well known wire bonding process and known wire bonding equipment.

Figure 3I:
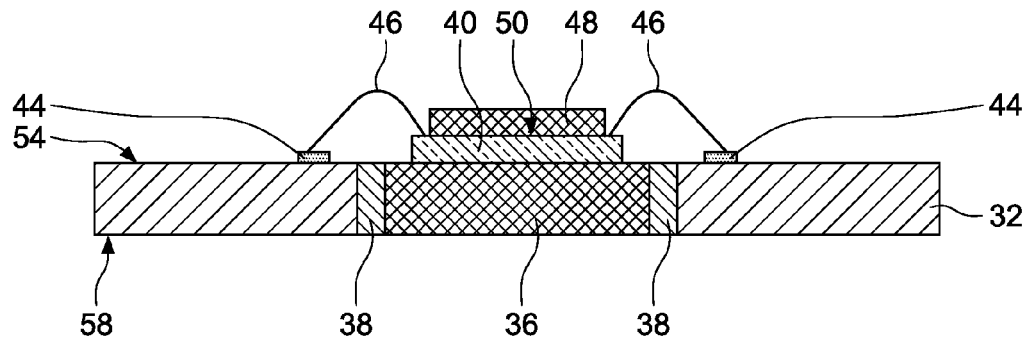

FIG. 3I shows the step of attaching the second magnetic shield 48 to the top surface 50 of the MRAM die 40. The second magnetic shield 48 may be attached to the MRAM die 40 using an adhesive such as epoxy. In this exemplary embodiment of the present invention, the second magnetic shield 48 includes a Ni/Fe slug. The second magnetic shield 48 may be placed on the MRAM die 40 using a pick and place tool. The second magnetic shield 48 is sized and shaped to fit on the top surface of the die 40 without impinging or contacting the bond wires 46. The thickness of the second magnetic shield 48 depends on shielding requirements and package size requirements. For example, if package thickness is not a concern then a thicker magnetic shield may be used.

Figure 3J:
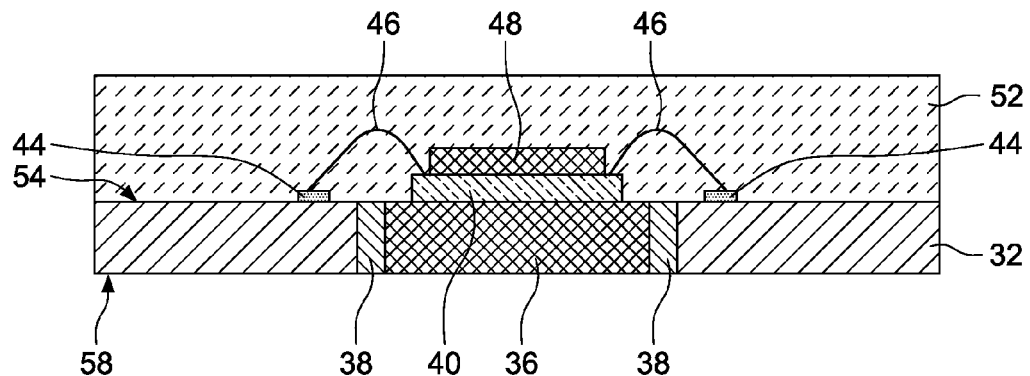

FIG. 3J shows the step of dispensing an encapsulating material 52 such as epoxy onto the second major surface 54 of the substrate 32. The encapsulating material 52 covers the MRAM die 40, the second magnetic shield 48 and a portion of the top surface of the first magnetic shield 36. The encapsulating material 52 may be dispensed with a nozzle of a conventional dispensing machine, as is known in the art.

Alternatively, the encapsulating material 52 may include a silica-filled resin, a ceramic, a halide-free material, the like, or combinations of the above. The encapsulating material is typically applied using a liquid, which is then heated to form a solid by curing in a UV or ambient atmosphere. The encapsulating material 52 can also be a solid that is heated to form a liquid and then cooled to form a solid mold. Any other encapsulating process may be used.

Figure 3K:
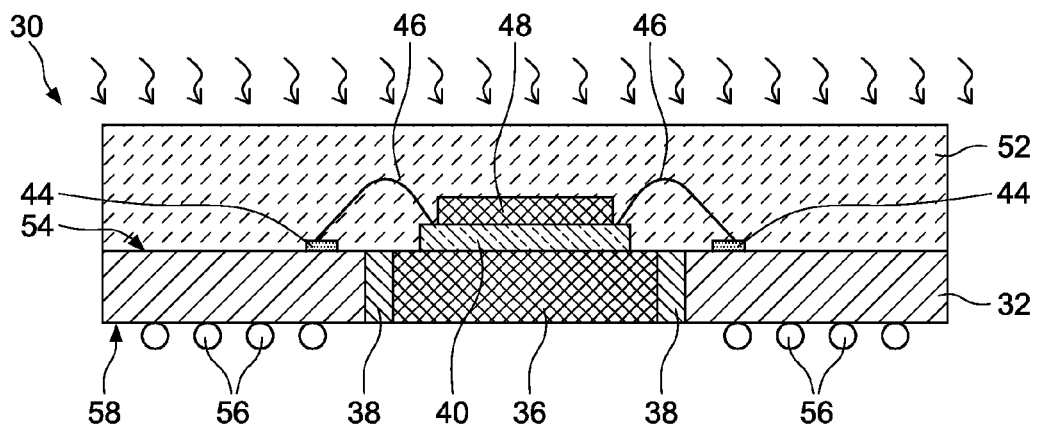

Subsequently, the encapsulating material 52 and the adhesives for attaching the MRAM die 40 and the first and second magnetic shields 36 and 48 are cured in an oven, as shown in FIG. 3K to form the semiconductor device 30. Further, solder balls 56 are attached to the first major surface 58 to facilitate external electrical communication with the MRAM die 40. The ball attach process may be performed in a reflow oven or by means of an infrared heater that causes the solder balls 56 to melt.

The fabrication process above describes packaging of a single die. As will be appreciated by those skilled in the art the process may be utilized to form a stacked package configuration having more than one die containing magnetically sensitive material.

The present invention, as described above, allows for packaging a MRAM die. Two magnetic shields are employed to protect the MRAM die from two sides in a ball grid array package. As described above, the first magnetic shield is embedded within the substrate and is placed below the MRAM die. Moreover, the second magnetic shield is placed on top of the MRAM die thereby enhancing the magnetic resistance of such packages. The magnetic shielding structure described above has good shielding property and can resist about 100 Gs external field.

By now it should be appreciated that there has been provided an improved MRAM device and a method of assembling the MRAM device. Circuit details are not disclosed because knowledge thereof is not required for a complete understanding of the invention. Although the invention has been described using relative terms such as "front," "back," "top," "bottom," "over," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A method of assembling a semiconductor device, comprising the steps of:
   providing a substrate having a centrally located opening therein;
   applying a tape to a first major surface of the substrate;
   placing a first magnetic shield onto the tape and within the substrate opening;
   applying an adhesive between the first magnetic shield and the substrate so that the first magnetic shield is attached to the substrate; and
   removing the tape.

2. The method of assembling a semiconductor device of claim 1, wherein the substrate comprises a multi-layer printed wiring board.

3. The method of assembling a semiconductor device of claim 1, further comprising curing the adhesive.

4. The method of assembling a semiconductor device of claim 1, wherein the first magnetic shield comprise a Ni/Fe slug.

5. The method of assembling a semiconductor device of claim 1, further comprising:
   attaching a semiconductor die to a first major surface of the first magnetic shield, wherein a bottom surface of the die is attached to the first major surface of the first magnetic shield;
   attaching a second magnetic shield to a top surface of the semiconductor die; and
   dispensing an encapsulating material onto a second major surface, opposite the first major surface, of the substrate such that the encapsulating material covers the semiconductor die and the first and second magnetic shields.

6. The method of assembling a semiconductor device of claim 5, further comprising electrically connecting bond pads of the semiconductor die to corresponding pads on the second major surface of the substrate.

7. The method of assembling a semiconductor device of claim 6, wherein the electrically connecting step comprises connecting the bond pads of the semiconductor die to the substrate pads with wires using a wire bonding process.

8. The method of assembling a semiconductor device of claim 5, further comprising attaching a plurality of solder balls to the first major surface of the substrate to facilitate external electrical communication with the semiconductor die.

9. The method of assembling a semiconductor device of claim 5, wherein the semiconductor die comprises a magnetoresistive random access memory (MRAM) device.

10. A semiconductor device packaged in accordance with the method of claim 5.

11. A semiconductor device, comprising:
a substrate having a centrally located opening therein;
a first magnetic shield disposed within the opening, wherein the first magnetic shield is attached to the substrate via an adhesive material;
a semiconductor die attached to a top surface of the first magnetic shield and electrically coupled to the substrate;
a second magnetic shield attached to a top surface of the semiconductor die; and
an encapsulating material covering a first major surface of the substrate, the semiconductor die, the second magnetic shield, and a portion of the top surface of the first magnetic shield.

12. The semiconductor device of claim 11, wherein the semiconductor die comprises a magnetoresistive random access memory (MRAM) die.

13. The semiconductor device of claim 11, wherein the first and second magnetic shields comprise Ni/Fe slugs.

14. The semiconductor device of claim 11, wherein the encapsulating material comprises epoxy.

15. The semiconductor device of claim 11, wherein the substrate comprises a multi-layered printed wiring board.

16. The semiconductor device of claim 11, further comprising a plurality of solder balls attached to a bottom surface of the substrate, wherein the solder balls facilitate external electrical communication with the die.

17. A method of assembling a magnetoresistive random access memory (MRAM) device, comprising the steps of:
providing a substrate having a centrally located opening therein;
applying a tape to a first major surface of the substrate;
placing a first magnetic shield onto the tape and within the substrate opening;
applying an adhesive between the first magnetic shield and the substrate such that the first magnetic shield is attached to the substrate;
curing the adhesive;
attaching a semiconductor die to a top surface of the first magnetic shield;
electrically connecting bond pads of the MRAM die to corresponding pads on a second major surface, opposite to the first major surface, of the substrate with wires using a wire bonding process;
attaching a second magnetic shield to a top surface of the MRAM die;
dispensing an encapsulating material onto the second major surface of the substrate, the MRAM die, the second magnetic shield and a portion of the top surface of the first magnetic shield;
curing the encapsulating material;
removing the tape; and
attaching solder balls to the first major surface of the substrate.

18. The method of assembling a MRAM device of claim 17, wherein the first and second magnetic shields comprise Ni/Fe slugs.

19. The method of assembling a MRAM device of claim 17, wherein the substrate comprises a multi-layer printed wiring board.

20. The method of assembling a MRAM device of claim 17, wherein the solder balls comprise controlled collapse chip connection (C4) solder balls.

* * * * *